US010526433B2

(12) United States Patent
Iwasaki et al.

(10) Patent No.: US 10,526,433 B2
(45) Date of Patent: Jan. 7, 2020

(54) (METH)ACRYLATE COMPOSITION

(71) Applicant: IDEMITSU KOSAN CO., LTD., Tokyo (JP)

(72) Inventors: Takeshi Iwasaki, Chiba (JP); Daichi Ogawa, Chiba (JP); Yutaka Obata, Chiba (JP); Tomoaki Takebe, Chiba (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 0 days.

(21) Appl. No.: 14/804,482

(22) Filed: Jul. 21, 2015

(65) Prior Publication Data

US 2015/0322233 A1   Nov. 12, 2015

Related U.S. Application Data

(63) Continuation of application No. 13/881,097, filed as application No. PCT/JP2011/074060 on Oct. 19, 2011, now abandoned.

(30) Foreign Application Priority Data

Oct. 25, 2010 (JP) ................................ 2010-239001

(51) Int. Cl.
*C08F 220/32* (2006.01)
*C08F 220/04* (2006.01)
*C08F 224/00* (2006.01)
*C08F 230/02* (2006.01)
*C08F 230/08* (2006.01)
*C08K 3/22* (2006.01)
*H01L 33/60* (2010.01)
*H01L 33/46* (2010.01)

(52) U.S. Cl.
CPC .......... *C08F 220/32* (2013.01); *C08F 220/04* (2013.01); *C08F 224/00* (2013.01); *C08F 230/02* (2013.01); *C08F 230/08* (2013.01); *C08K 3/22* (2013.01); *H01L 33/46* (2013.01); *H01L 33/60* (2013.01); *C08K 2003/2241* (2013.01)

(58) Field of Classification Search
CPC .... C08F 220/04; C08F 220/06; C08F 220/32; C08F 220/346; C08F 2220/325; C08F 2220/346; C08F 2220/1833; C08F 2220/1841; C08F 2220/185; C08F 2220/1858; C08F 2220/1866; C08F 2220/1875; C08F 2220/1883; C08F 2220/1891; C08F 2220/285; C08F 2220/286; C08F 2220/287; C08F 2220/288; C08F 2220/305; C08F 2220/306; C08F 2220/307; C08F 2220/308; C08F 230/08; C08F 230/02; C08F 224/00
See application file for complete search history.

(56) References Cited

U.S. PATENT DOCUMENTS

| | | | |
|---|---|---|---|
| 6,558,753 B1 * | 5/2003 | Ylitalo ................. | C09D 11/101 427/466 |
| 6,706,826 B1 * | 3/2004 | Fujiwara ................ | G03F 7/039 430/326 |
| 8,013,091 B2 | 9/2011 | Obata et al. | |
| 2008/0090929 A1 * | 4/2008 | Wilson ................. | C09D 11/101 522/75 |
| 2008/0097072 A1 | 4/2008 | Takebe et al. | |
| 2009/0246415 A1 * | 10/2009 | Horie ....................... | G02B 1/11 428/1.3 |
| 2010/0022733 A1 | 1/2010 | Ota et al. | |
| 2010/0234527 A1 | 9/2010 | Ota et al. | |
| 2010/0243303 A1 * | 9/2010 | Arifuku ............. | C08G 73/1039 174/258 |
| 2010/0323197 A1 * | 12/2010 | Maeda .................. | C09J 7/0217 428/355 AC |
| 2010/0330354 A1 * | 12/2010 | Tsukagoshi ............ | C09J 7/0246 428/220 |
| 2011/0288231 A1 | 11/2011 | Obata et al. | |
| 2012/0142867 A1 | 6/2012 | Iwasaki et al. | |

FOREIGN PATENT DOCUMENTS

| | | | |
|---|---|---|---|
| JP | 7-041728 | | 2/1995 |
| JP | 07041728 A | * | 2/1995 |
| JP | 7 233160 | | 9/1995 |
| JP | 7 247278 | | 9/1995 |

(Continued)

OTHER PUBLICATIONS

International Search Report dated Jan. 24, 2012 in PCT/JP11/74060 Filed Oct. 19, 2011.
Office Action dated Apr. 14, 2015, in Japanese patent application No. 2012-540803.
European Search Report dated May 30, 2014 in PCT/JP2011/074060 (filed Oct. 19, 2011).

*Primary Examiner* — Ling Siu Choi
*Assistant Examiner* — David L Miller
(74) *Attorney, Agent, or Firm* — Oblon, McClelland, Maier & Neustadt, L.L.P.

(57) ABSTRACT

Provided is a (meth)acrylate composition containing: (A) at least one (meth)acrylate compound selected from the group consisting of a (meth)acrylate-modified silicone oil, a (meth)acrylate having a long-chain aliphatic hydrocarbon group, and a polyalkylene glycol (meth)acrylate having number-average molecular weight of not less than 400; (B) a (meth)acrylate compound to which an alicyclic hydrocarbon group having 6 or more carbon atoms is ester-linked; (C) (meth)acrylic acid or a (meth)acrylate compound having a polar group; (D) a radical polymerization initiator; and (E) a white pigment.

20 Claims, No Drawings

(56) References Cited

FOREIGN PATENT DOCUMENTS

| | | | | |
|---|---|---|---|---|
| JP | 2001335739 A | * | 12/2001 | |
| JP | 2005-076017 | | 3/2005 | |
| JP | 2008 127503 | | 6/2008 | |
| JP | 2008 231231 | | 10/2008 | |
| JP | 2008 243892 | | 10/2008 | |
| JP | 2008231231 A | * | 10/2008 | |
| JP | WO 2009005118 A1 | * | 1/2009 | ............ C09J 7/0217 |
| JP | 2010 18786 | | 1/2010 | |
| JP | 2010 21533 | | 1/2010 | |
| JP | 2010 47740 | | 3/2010 | |
| JP | 2010 106243 | | 5/2010 | |
| KR | 10-2010-0003717 A | | 1/2010 | |
| WO | 2006 051803 | | 5/2006 | |
| WO | 2007 129536 | | 11/2007 | |
| WO | WO 2010033571 A1 | * | 3/2010 | ................ C09J 7/00 |
| WO | 2011 016356 | | 2/2011 | |

* cited by examiner

(METH)ACRYLATE COMPOSITION

This is a continuation of U.S. application Ser. No. 13/881,097, filed Apr. 23, 2013, which is the National Stage of International application no. PCT/JP2011/074060, filed Oct. 19, 2011, which claimed priority to Japanese patent application no. 2010-239001, filed Oct. 25, 2010, of which all of the disclosures are incorporated herein by reference in their entireties.

TECHNICAL FIELD

The present invention relates to a composition which contains a (meth)acrylate compound, more specifically, to a composition suitably used as a raw material of a reflective material for an optical semiconductor and to a cured product thereof.

BACKGROUND ART

Since 1990s, progress of a light-emitting diode (LED) is remarkable whereby multicolor is progressing along with increase of output power. In particular, a white LED is expected to be a next generation light source to replace existing lamps such as a white lamp, a halogen lamp, and an HID lamp. In fact, an LED is valued in such characteristics as its long life, low power consumption, high heat stability, and low-voltage drive. Therefore, it is used in a display, a destination sign board, a car lamp, a signal light, an emergency light, a cell phone, a video camera, and so on. Such luminescent devices are usually manufactured by fixing an LED to a concave-shaped reflective material formed of a synthetic resin integrally molded with a lead frame and then by sealing it with a sealant such as an epoxy resin and a silicone resin.

As the reflective material for the LED, a polyamide resin is widely used nowadays. However, the reflectance decreases after a long-term usage due to the deterioration of the resin caused by increase of heat generation and optical intensity which is resulted from enhanced output power of the LED. Therefore, a measure to remedy this problem is desired.

To cope with this problem, for example, a reflective material made using a silicone resin is proposed in Patent Documents 1 to 3 and a reflective material made using an epoxy resin is proposed in Patent Document 4. But none of them has yet been used widely in practice. Especially when a silicone resin is used, problems are concerned in association with evaporation of a low molecular weight siloxane which may cause a contact malfunction and penetration of water vapor into the luminescent device which may cause damage to the light emitting element.

On the other hand, a reflective material made using a (meth)acrylate resin is disclosed in Patent Documents 5 and 6. In such reflective material, hollow particles are used as a filler to increase reflectance in the ultraviolet light region. It is disclosed that high reflectance in the visible light region can be achieved by laminating the material with a material which has high visible light reflectance.

CITATION LIST

Patent Literature

Patent Document 1: JP-A-2010-18786
Patent Document 2: JP-A-2010-21533
Patent Document 3: JP-A-2010-106243
Patent Document 4: JP-A-2010-47740
Patent Document 5: JP-A-2008-231231
Patent Document 6: JP-A-2008-243892

SUMMARY OF INVENTION

Technical Problem

In view of the situation as mentioned above, a reflective material having high reflectance in the visible light region and the excellent adhesion with adjacent parts (lead frame and sealant) without reflectance decrease even after a long-term usage is desired.

Accordingly, the problem to be solved by the present invention is to provide a (meth)acrylate composition which provides a cured product having high reflectance in the visible light region, the excellent heat resistance and light resistance, and the excellent adhesion with adjacent parts, thereby suitably used as a raw material of a reflective material for an optical semiconductor.

Solution to Problem

The present inventors carried out an extensive investigation and as a result, found that the above problem is solved by a composition containing a certain acrylate compound. The present invention was accomplished based on this finding.

That is, the present invention provides a (meth)acrylate composition, a cured product, and a reflective material, as shown below.

[1] A (meth)acrylate composition comprising:
(A) at least one (meth)acrylate compound selected from the group consisting of a (meth)acrylate-modified silicone oil, a (meth)acrylate having a long-chain aliphatic hydrocarbon group, and a polyalkylene glycol (meth)acrylate having number-average molecular weight of not less than 400,
(B) a (meth)acrylate compound to which an alicyclic hydrocarbon group having 6 or more carbon atoms is ester-linked,
(C) (meth)acrylic acid or a (meth)acrylate compound having a polar group,
(D) a radical polymerization initiator, and
(E) a white pigment.

[2] The (meth)acrylate composition according to [1], wherein
the amount of the component (A) is 5 to 90% by mass, the amount of the component (B) is 5 to 90% by mass, and the amount of the component (C) is 0.5 to 50% by mass, based on totality of the components (A), (B) and (C), and
the amount of the component (D) is 0.01 to 10 parts by mass and the amount of the component (E) is 3 to 200 parts by mass, relative to 100 parts by mass of totality of the components (A), (B) and (C).

[3] The (meth)acrylate composition according to [1] or [2], wherein the component (A) is a (meth)acrylate having an aliphatic hydrocarbon group with 12 or more carbon atoms and/or a polyalkylene glycol (meth)acrylate having number-average molecular weight of not less than 400.

[4] The (meth)acrylate composition according to any of [1] to [3], wherein the component (A) is hydrogenated polybutadiene di(meth)acrylate, hydrogenated polyisoprene di(meth)acrylate, and/or polyethylene glycol di(meth)acrylate having number-average molecular weight of not less than 400.

[5] The (meth)acrylate composition according to any of [1] to [4], wherein the component (B) is a (meth)acrylate compound which is ester-linked with at least one alicyclic hydrocarbon group selected from the group consisting of adamantyl, norbornyl, isobornyl, dicyclopentanyl, and cyclohexyl.

[6] The (meth)acrylate composition according to any of [1] to [5], wherein the component (C) is a (meth)acrylate compound having a polar group selected from the group consisting of hydroxyl, epoxy, glycidyl ether, tetrahydrofurfuryl, isocyanate, carboxyl, alkoxysilyl, phosphate ester, lactone, oxetane, and tetrahydropyranyl.

[7] A cured product obtained by curing the (meth)acrylate composition according to any of [1] to [6].

[8] A reflective material made using the cured product according to [7].

[9] The reflective material according to [8], wherein the reflective material is a reflective material for an optical semiconductor.

Advantageous Effects of Invention

The (meth)acrylate composition of the present invention provides a cured product having high reflectance in the visible light region with the excellent whiteness, the excellent heat resistance and light resistance, and with less yellowing, and having the excellent adhesion with adjacent parts (especially with a lead frame), thereby suitably used as a raw material of a reflective material for an optical semiconductor.

A reflective material made using the cured product obtained by curing the (meth)acrylate composition of the present invention does not decrease in its reflectance even after a long-term usage, while having high reflectance in the visible light region and the excellent adhesion with adjacent parts.

DESCRIPTION OF EMBODIMENTS (Meth)acrylate Composition

The (meth)acrylate composition of the present invention contains:

(A) at least one (meth)acrylate compound selected from the group consisting of a (meth)acrylate-modified silicone oil, a (meth)acrylate having a long-chain aliphatic hydrocarbon group, and a polyalkylene glycol (meth)acrylate having number-average molecular weight of not less than 400, (B) a (meth)acrylate compound to which an alicyclic hydrocarbon group having 6 or more carbon atoms is ester-linked, (C) (meth)acrylic acid or a (meth)acrylate compound having a polar group, (D) a radical polymerization initiator, and (E) a white pigment.

Component (A)

The component (A) used in the composition of the present invention is at least one (meth)acrylate compound selected from the group consisting of a (meth)acrylate-modified silicone oil, a (meth)acrylate having a long-chain aliphatic hydrocarbon group, and a polyalkylene glycol (meth)acrylate having number-average molecular weight of not less than 400. Since the composition of the present invention contains the component (A), mainly flexibility is achieved so that formation of a crack may be suppressed.

(Meth)acrylate-Modified Silicone Oil

The (meth)acrylate-modified silicone oil used in the present invention is a compound which has an acryl group and/or a methacryl group at its terminal, and preferably contains a dialkyl polysiloxane in the backbone. This (meth)acrylate-modified silicone oil is a modified compound of dimethyl polysiloxane in many cases, but all or a part of the alkyl groups in the dialkyl polysiloxane backbone may be substituted with a phenyl group or an alkyl group other than a methyl group in place of the methyl group. Examples of the alkyl group other than the methyl group include an ethyl group and a propyl group. As the commercially available products of such compound, a single-end reactive silicone oil (for example, X-22-174DX, X-22-2426, and X-22-2475), a dual-end reactive silicone oil (for example, X-22-164A, X-22-164C, and X-22-164E) (all of the above are tradenames and are manufactured by Shin-Etsu Chemical Co., Ltd.), a methacrylate-modified silicone oil (for example, BY16-152D, BY16-152, and BY16-152C) (all of the above are tradenames and are manufactured by Dow Corning Toray Co., Ltd.), and the like may be used.

In addition, as a (meth)acrylate-modified silicone oil, a polydialkyl siloxane having an acryloxyalkyl terminal or a methacryloxyalkyl terminal may be used. Specific examples thereof include methacryloxypropyl-terminated polydimethylsiloxane, (3-acryloxy-2-hydroxypropyl)-terminated polydimethylsiloxane, an ABA type triblock copolymer of acryloxy-terminated ethylene oxide dimethylsiloxane (A block) and ethylene oxide (B block), and methacryloxypropyl-terminated branched polydimethylsiloxane.

Among them, in view of adhesion of the cured product, (3-acryloxy-2-hydroxypropyl)-terminated polydimethylsiloxane and an ABA type triblock copolymer of acryloxy-terminated ethylene oxide dimethylsiloxane (A block) and ethylene oxide (B block) are suitably used.

(Meth)acrylate Having a Long-Chain Aliphatic Hydrocarbon Group

The (meth)acrylate having a long-chain aliphatic hydrocarbon group used in the present invention is a compound having a (meth)acrylate group bonded to a residue after a hydrogen atom is removed from a long-chain aliphatic hydrocarbon compound.

As to the aliphatic hydrocarbon compound that can derive the (meth)acrylate having a long-chain aliphatic hydrocarbon group used in the present invention is preferably an alkane, in view of adhesion of the cured product of the present invention, an alkane having 12 or more carbon atoms being more preferable.

In view of adhesion of the cured product of the present invention, the long-chain aliphatic hydrocarbon group is more preferably an aliphatic hydrocarbon group having 12 or more carbon atoms. By using the (meth)acrylate containing a long-chain aliphatic hydrocarbon group having 12 or more carbon atoms as the component (A), the composition of the present invention can provide the cured product with the excellent adhesion.

In the (meth)acrylate having a long-chain aliphatic hydrocarbon group used in the present invention, number of the (meth)acrylate group is not particularly limited and one or a plurality of the groups may be allowed. When there is one (meth)acrylate group, the long-chain aliphatic hydrocarbon group is preferably a long-chain alkyl group, more preferably an alkyl group having 12 or more carbon atoms (preferably 12 to 24 carbon atoms, more preferably 12 to 18 carbon atoms). When there are two (meth)acrylate groups, the long-chain aliphatic hydrocarbon group is preferably a long-chain alkylene group, more preferably an alkylene group having 12 or more carbon atoms (preferably 12 to 24 carbon atoms, more preferably 12 to 18 carbon atoms).

Specific examples of the alkyl group having 12 or more carbon atoms include dodecyl (including lauryl), tetradecyl, hexadecyl, octadecyl (including stearyl), eicosyl, triacontyl, and tetracontyl. Alternatively, the alkyl group having 12 or more carbon atoms may be an alkyl group derived from a hydrogenated product of polybutadiene, polyisoprene, and the like. Specific examples of the alkylene group having 12 or more carbon atoms include a divalent residue resulted by removing hydrogen atoms from the foregoing alkyl groups.

Specific examples of the (meth)acrylate having a long-chain aliphatic hydrocarbon group include an acryl or a methacryl compound having a hydrogenated polybutadiene backbone or a hydrogenated polyisoprene backbone, such as hydrogenated polybutadiene di(meth)acrylate and hydrogenated polyisoprene di(meth)acrylate, or stearyl methacrylate. Among them, in view of adhesion of the cured product, hydrogenated polybutadiene di(meth)acrylate and hydrogenated polyisoprene di(meth)acrylate are preferable.

Polyalkylene Glycol (Meth)acrylate Having Number-Average Molecular Weight of not Less than 400

By using the polyalkylene glycol (meth)acrylate having number-average molecular weight of not less than 400 as the component (A), the composition of the present invention can provide a cured product with the excellent toughness and adhesion. In the polyalkylene glycol (meth)acrylate having number-average molecular weight of not less than 400 used in the present invention, number of the (meth)acrylate group is not particularly limited and one or plurality of the groups may be allowed.

Specific examples of the polyalkylene glycol (meth)acrylate having number-average molecular weight of not less than 400 include polyethylene glycol di(meth)acrylate, polypropylene glycol di(meth)acrylate, polybutylene glycol di(meth)acrylate, ethoxylated trimethylolpropane tri(meth)acrylate, and ethoxylated pentaerythritol tetra(meth)acrylate. Among them, in view of toughness and adhesion, polyethylene glycol di(meth)acrylate is preferable.

In view of toughness and adhesion as well as compatibility with the component (B), the number-average molecular weight of such compound is preferably 400 to 10,000, more preferably 450 to 5,000, still more preferably 500 to 3,000.

In the present invention, as the component (A), at least one selected from the (meth)acrylate-modified silicone oils, at least one selected from the (meth)acrylates having a long-chain aliphatic hydrocarbon group, or at least one selected from the polyalkylene glycol (meth)acrylates having number-average molecular weight of not less than 400 may be used. Alternatively, a combination of the compounds appropriately selected from the (meth)acrylate-modified silicone oils, the (meth)acrylates having a long-chain aliphatic hydrocarbon group, and the polyalkylene glycol (meth)acrylates having number-average molecular weight of not less than 400 may be used.

Content of the component (A) in the composition of the present invention is preferably 5 to 90% by mass, more preferably 15 to 80% by mass, still more preferably 20 to 70% by mass, based on totality of the components (A), (B) and (C), in view of toughness and adhesion.

Component (B)

The component (B) used in the composition of the present invention is a (meth)acrylate compound to which an alicyclic hydrocarbon group having 6 or more carbon atoms is ester-linked.

As will be mentioned later, it is preferable that viscosity of a mixed solution of the components (A) to (C) be higher in view of dispersibility of a white pigment as the component (E). However, if a highly viscous monomer (for example, hydrogenated polybutadiene diacrylate) is used as the component (A), hardness of the cured product decreases. Therefore, it is preferable to combine it with a monomer which leads to a polymer having a high glass transition temperature (Tg). Accordingly, in view of the above-mentioned aspect, a (meth)acrylate having a substituent with an alicyclic structure is preferred to a (meth)acrylate having a substituent with a linear or branched structure as the component (B), because the former leads to a polymer with higher Tg than the latter.

Further, in the composition of the present invention, by using the (meth)acrylate having an alicyclic hydrocarbon group with 6 or more carbon atoms as the component (B), the cured product thereof is excellent in its hardness, heat resistance, and light resistance. In addition, because the ester substituent is an alicyclic hydrocarbon group not containing an aromatic group and the like, deterioration thereof by an ultraviolet light is unlikely to occur.

Specific examples of the alicyclic hydrocarbon group having 6 or more carbon atoms in such compounds include cyclohexyl, 2-decahydronaphthyl, adamantyl, 1-methyladamantyl, 2-methyladamantyl, biadamantyl, dimethyladamantyl, norbornyl, 1-methyl-norbornyl, 5,6-dimethyl-norbornyl, isobornyl, tetracyclo[4.4.0.12,5.17,10]dodecyl, 9-methyl-tetracyclo[4.4.0.12,5.17,10]dodecyl, bornyl, and dicyclopentanyl. Among them, in view of hardness, heat resistance, and light resistance of the cured product thereof, cyclohexyl, adamantyl, norbornyl, isobornyl, and dicyclopentanyl are preferable, adamantyl being more preferable, and 1-methyladamantyl being still more preferable.

Specific examples of the (meth)acrylate compound having the alicyclic hydrocarbon group in the component (B) include cyclohexyl (meth)acrylate, 1-adamantyl (meth)acrylate, norbornyl (meth)acrylate, isobornyl (meth)acrylate, and dicyclopentanyl (meth)acrylate. In the present invention, these (meth)acrylate compounds may be used alone or in a combination of two or more kinds as the component (B).

Meanwhile, since the viscosity of a monomer which leads to a polymer having high Tg is generally low, it is preferable that a monomer which leads to a polymer having a further higher Tg be used to avoid decrease in viscosity of a mixed solution of the components (A) to (C). By using the monomer which leads to a polymer having a further higher Tg, smaller content thereof in the composition may be used so that hardness of the cured product can be made higher without decreasing viscosity of the solution. In view of the above-mentioned aspect, a (meth)acrylate having an adamantane structure which provides a polymer having high Tg is preferable as the component (B), 1-adamantyl (meth)acrylate being particularly preferable.

In view of harness, heat resistance, and light resistance, content of the component (B) in the composition of the present invention is preferably 5 to 90% by mass, more preferably 10 to 80% by mass, still more preferably 20 to 70% by mass, based on totality of the components (A), (B) and (C).

Component (C)

The component (C) used in the composition of the present invention is (meth)acrylic acid or a (meth)acrylate compound having a polar group. Since these compounds have a polar character, adhesion with metal surface and the like having a polar character is improved due to a formation of a hydrogen bond and the like by incorporating the component (C) into the composition of the present invention. In addition, wettability thereof is improved owing to the presence of the polar group. Meanwhile, although an alkylene glycol group may be involved in giving of adhesion, an alkylene glycol (meth)acrylate shall not be included in the component (C).

(Meth)Acrylate Compound Having a Polar Group

As the (meth)acrylate compound having a polar group, (meth)acrylate compounds having a substituent containing an atom other than carbon and hydrogen ester-linked thereto are exemplified. Examples of the substituent include hydroxyl, epoxy, glycidyl ether, tetrahydrofurfuryl, isocyanate, carboxyl, alkoxysilyl, phosphate ester, lactone, oxetane, tetrahydropyranyl, and amino.

Specific examples of the (meth)acrylate compound having a polar group include 2-hydroxyethyl (meth)acrylate, 2-hydroxypropyl (meth)acrylate, 2-hydroxybutyl (meth) acrylate, 4-hydroxybutyl (meth)acrylate (for example, tradename: 4-HBA, manufactured by Nippon Kasei Chemical Co., Ltd.), cyclohexanedimethanol mono(meth)acrylate (for example, tradename: CHMMA, manufactured by Nippon Kasei Chemical Co., Ltd.), glycidyl (meth)acrylate, 4-hydroxybutyl acrylate glycidyl ether (for example, tradename: 4-HBAGE, manufactured by Nippon Kasei Chemical Co., Ltd.), tetrahydrofurfuryl (meth)acrylate, 2-isocyanatoethyl (meth)acrylate, 2-(meth)acryloyloxyethyl succinate, 2-(meth)acryloyloxyethyl hexahydrophthalate, 3-(meth)acryloxypropyl trimethoxy silane, 3-(meth)acryloxypropyl methyl dimethoxy silane, 3-(meth)acryloxypropyl triethoxy silane, 3-(meth)acryloxypropyl methyl diethoxy silane, 2-(meth)acryloyloxyethyl phosphate, di(2-(meth)acryloyloxyethyl) phosphate, KAYAMER PM-21 (tradename, manufactured by Nippon Kayaku Co., Ltd.), γ-butyrolactone (meth)acrylate, (meth)acrylic acid (3-methyl-3-oxetanyl), (meth)acrylic acid (3-ethyl-3-oxetanyl), tetrahydrofurfuryl (meth)acrylate, dimethylaminoethyl (meth)acrylate, and diethylaminoethyl (meth)acrylate.

In the present invention, at least one selected from the foregoing (meth)acrylic acids, or at least one selected from the foregoing (meth)acrylate compounds having the polar group may be used as the component (C), Alternatively, a combination of appropriately selected compounds from the foregoing (meth)acrylic acids and the foregoing (meth)acrylate compounds having the polar group may be used.

Content of the component (C) in the composition of the present invention is preferably 0.5 to 50% by mass, more preferably 1 to 40% by mass, still more preferably 3 to 20% by mass, based on totality of the components (A), (B) and (C), in view of adhesion.

Component (D)

The component (D) used in the composition of the present invention is a radical polymerization initiator.

Although the radical polymerization initiator is not particularly limited, specific examples thereof include ketone peroxides, hydroperoxides, diacyl peroxides, dialkyl peroxides, peroxyketals, alkyl peresters (peroxyesters), and peroxy carbonates.

Specific examples of the ketone peroxide include methyl ethyl ketone peroxide, methyl isobutyl ketone peroxide, acetylacetone peroxide, cyclohexanone peroxide, and methylcyclohexanone peroxide.

Specific examples of the hydroperoxide include 1,1,3,3-tetramethylbutyl hydroperoxide, cumene hydroperoxide, t-butyl hydroperoxide, p-menthane hydroperoxide, and diisopropylbenzene hydroperoxide.

Specific examples of the diacyl peroxide include diisobutyryl peroxide, bis-3,5,5-trimethylhexanol peroxide, dilauroyl peroxide, dibenzoyl peroxide, m-toluyl benzoyl peroxide, and succinic acid peroxide.

Specific examples of the dialkyl peroxide include dicumyl peroxide, 2,5-dimethyl-2,5-di(t-butylperoxy)hexane, 1,3-bis(t-butylperoxyisopropyl)hexane, t-butylcumyl peroxide, di-t-butyl peroxide, di-t-hexyl peroxide, and 2,5-dimethyl-2,5-di(t-butylperoxy)hexyne-3.

Specific examples of the peroxyketal include 1,1-di-t-hexylperoxy-3,3,5-trimethylcyclohexane, 1,1-di-t-hexylperoxycyclohexane, 1,1-di-t-butylperoxy-2-methylcyclohexane, 1,1-di-t-butylperoxycyclohexane, 2,2-di(t-butylperoxy)butane, and butyl 4,4-bis-t-butylperoxypentanoate.

Specific examples of the alkyl perester (peroxy esters) include 1,1,3,3-tetramethylbutylperoxy neodecanoate, α-cumylperoxy neodecanoate, t-butylperoxy neodecanoate, t-hexylperoxy neodecanoate, t-butylperoxy neoheptanoate, t-hexylperoxy pivalate, t-butylperoxy pivalate, 1,1,3,3-tetramethylbutylperoxy-2-ethyl hexanoate, t-amylperoxy-2-ethyl hexanoate, t-butylperoxy-2-ethyl hexanoate, t-butylperoxy isobutyrate, di-t-butylperoxy hexahydroterephthalate, 1,1,3,3-tetramethylbutylperoxy-3,5,5-trimethyl hexanoate, t-amylperoxy-3,5,5-trimethyl hexanoate, t-butylperoxy-3,5,5-trimethyl hexanoate, t-butylperoxy acetate, t-butylperoxy benzoate, dibutylperoxytrimethyl adipate, 2,5-dimethyl-2,5-di-2-ethylhexanoylperoxyhexane, t-hexylperoxy-2-ethyl hexanoate, t-hexylperoxy isopropyl monocarbonate, t-butylperoxy laurate, t-butylperoxy isopropyl monocarbonate, t-butylperoxy-2-ethylhexyl monocarbonate, and 2,5-dimethyl-2,5-di-benzoylperoxyhexane.

Specific examples of the peroxy carbonate include di-n-propylperoxy dicarbonate, diisopropylperoxy carbonate, di-4-t-butylcyclohexylperoxy carbonate, di-2-ethylhexylperoxy carbonate, di-sec-butylperoxy carbonate, di-3-methoxybutylperoxy dicarbonate, di-2-ethylhexylperoxy dicarbonate, diisopropyloxy dicarbonate, t-amylperoxy isopropyl carbonate, t-butylperoxy isopropyl carbonate, t-butylperoxy-2-ethylhexyl carbonate, and 1,6-bis(t-butylperoxycarboxyloxy)hexane.

Alternatively, a photo-radical polymerization initiator may be used as the radical polymerization initiator of the component (D). As the commercially available product of the radical polymerization initiator, IRGACURE 651, IRGACURE 184, DAROCUR 1173, IRGACURE 2959, IRGACURE 127, IRGACURE 907, IRGACURE 369, IRGACURE 379, DAROCUR TPO, IRGACURE 819, and IRGACURE 784 (all of these are tradenames and are manufactured by BASF SE), and the like may be used.

In the present invention, these radical polymerization initiators of the component (D) may be used alone or in a combination of two or more kinds.

Content of the component (D) in the composition of the present invention is preferably 0.01 to 10 parts by mass, more preferably 0.1 to 5 parts by mass, relative to 100 parts by mass of totality of the components (A), (B) and (C), in view of polymerization reactivity.

Component (E)

The component (E) used in the composition of the present invention is a white pigment. Incorporating the component (E) into the composition of the present invention allows to make the cured product white and to increase reflectance in the visible light region.

Specific examples of the white pigment include titanium dioxide, alumina, zirconium oxide, zinc sulfide, zinc oxide, magnesium oxide, silica, potassium titanate, barium sulfate, calcium carbonate, and silicone particle. Among them, titanium dioxide is preferable in view of high reflectance and availability. Among two crystal types of titanium dioxide, rutile and anatase, the rutile type is preferable in the present invention because the anatase type may cause deterioration of a resin due to its photocatalytic function.

Average particle diameter of the white pigment in the composition of the present invention is preferably in the range of 0.01 to 0.5 μm, more preferably 0.1 to 0.4 μm, still more preferably 0.15 to 0.3 μm in view of dispersibility of the white pigment.

Furthermore, the white pigment may be hollow particles. In the case that the white pigment is hollow particles, a visible light passing through an outer shell of the hollow particle is reflected in the hollow part. Therefore, it is preferable that difference between the refractive indexes of the constituent of the hollow particle and gas present in the hollow particle be large in order to increase reflectance in the hollow part. The gas present in the hollow particle is usually air; but inert gas such as nitrogen and argon may be used, or inside the hollow particle may be vacuum.

In addition, the white pigment may be optionally surface-treated with a silicon compound, an aluminum compound, an organic substance, and so on. Examples of the treatment include an alkylation treatment, a trimethylsilyl treatment, a silicone treatment, and a treatment by a coupling agent. The white pigment of the component (E) may be used alone or in a combination of two or more kinds.

Content of the component (E) in the composition of the present invention is preferably 1 to 200 parts by mass, more preferably 3 to 150 parts by mass, still more preferably 5 to 100 parts by mass, relative to 100 parts by mass of totality of the components (A), (B) and (C), in view of reflectance and mechanical strength.

Component (F)

The composition of the present invention may contain a (meth)acrylate compound other than the components (A) to (C) as the component (F) within the range not adversely affecting the effect of the present invention, in view of mechanical strength.

Specific examples of the (meth)acrylate compound of the component (F) include ethylene glycol di(meth)acrylate, propylene glycol di(meth)acrylate, 1,4-butanediol (meth) acrylate, 1,6-hexanediol di(meth)acrylate, 1,9-nonanediol di(meth)acrylate, neopentyldiol di(meth)acrylate, polyethylene glycol di(meth)acrylate and polypropylene glycol di(meth)acrylate having number-average molecular weight of less than 400, an alkoxypolyalkylene glycol (meth)acrylate such as methoxypolyethylene glycol methacrylate, ethylene oxide-modified bisphenol A di(meth)acrylate, propylene oxide-modified bisphenol A di(meth)acrylate, epichlorohydrin-modified bisphenol A di(meth)acrylate, propylene oxide-modified glycerin tri(meth)acrylate, trimethylolpropane tri(meth)acrylate, ditrimethylolpropane tetra (meth)acrylate, dipentaerythrirol hexa(meth)acrylate, tris (acryloyloxyethyl)isocyanurate, and methoxypolyethylene glycol (meth)acrylate.

The foregoing (meth)acrylate compounds of the component (F) may be used alone or in a combination of two or more kinds.

Content of the component (F) in the composition of the present invention is preferably 100 or less parts by mass, more preferably 50 or less parts by mass, relative to 100 parts by mass of totality of the components (A), (B) and (C), in view of not adversely affecting the effect of the present invention.

Additive

The composition of the present invention may further contain any additives such as an antioxidant, a photostabilizer, a UV absorber, a plasticizer, an inorganic filler, a coloring material, an antistatic agent, a lubricating agent, a mold releasing agent, and a flame retardant, within the range not adversely affecting the effect of the present invention.

Antioxidant

Examples of the antioxidant include a phenol antioxidant, a phosphorus antioxidant, a sulfur antioxidant, a vitamin antioxidant, a lactone antioxidant, and an amine antioxidant.

Examples of the phenol antioxidant include tetrakis[methylene-3-(3,5-di-t-butyl-4-hydroxyphenyl)propionate]methane, stearyl β-(3,5-di-t-butyl-4-hydroxyphenyl) propionate ester, 1,3,5-trimethyl-2,4,6-tris(3,5-di-t-butyl-4-hydroxybenzyl)benzene, tris(3,5-di-t-butyl-4-hydroxybenzyl) isocyanurate, tris[(3,5-di-t-butyl-4-hydroxyphenyl) propionyloxyethyl]isocyanurate, 2,6-di-t-butyl-4-methylphenol, 3,9-bis[1,1-dimethyl-2-{β-(3-t-butyl-4-hydroxy-5-methylphenyl)propionyloxy}ethyl]-2,4,8,10-tetraoxaspiro [5,5]undecane, and tris(2,6-dimethyl-3-hydroxy-4-t-butylbenzyl) isocyanurate. Commercially available products, for example, such as IRGANOX 1010, IRGANOX 1076, IRGANOX 1330, IRGANOX 3114, IRGANOX 3125, and IRGANOX 3790 (all of them are manufactured by BASF SE); CYANOX 1790 (manufactured by Cyanamid Corp.); SUMILIZER BHT and SUMILIZER GA-80 (both are manufactured by Sumitomo Chemical Co., Ltd.) (all of the above-mentioned are tradenames), and the like may be used.

Examples of the phosphorus antioxidant include tris(2,4-di-t-butylphenyl) phosphite, 2-[[2,4,8,10-tetrakis(1,1-dimethylethyl)dibenzo[d,f][1,3,2]dioxaphosphepin6-yl]oxy]-N, N-bis[2-[[2,4,8,10-tetrakis(1,1-dimethylethyl)dibenzo[d,f] [1,3,2]dioxaphosphepin-6-yl]oxy]-ethyl]ethanamine, cyclic neopentanetetrayl bis(2,6-di-t-butyl-4-methylphenyl) phosphite, and distearyl pentaerythritol diphosphite. Commercially available products, for example such as IRGAFOS 168, IRGAFOS 12, and IRGAFOS 38 (these are manufactured by BASF SE); ADK STAB 329K, ADK STAB PEP36, and ADK STAB PEP-8 (these are manufactured by ADEKA Corp.); Sandstab P-EPQ (manufactured by Clariant SE); and Weston 618, Weston 619G, and Weston-624 (these are manufactured by GE Company) (all of the above-mentioned are tradenames), and the like may be used.

Examples of the sulfur antioxidant include dilauryl thiodipropionate, distearyl thiodipropionate, dimyristyl thiodipropionate, lauryl stearyl thiodipropionate, pentaerythritol tetrakis(3-dodecylthiopropionate), and pentaerythritol tetrakis(3-laurylthiopropionate). Commercially available products, for example, such as DSTP "Yoshitomi", DLTP "Yoshitomi", DLTOIB, and DMTP "Yoshitomi" (all of them are manufactured by API Corp.); Seenox 412S (manufactured by SHIPRO KASEI KAISHA, Ltd.); Cyanox 1212 (manufactured by Cyanamid Corp.); and SUMILIZER TP-D (manufactured by Sumitomo Chemical Co., Ltd.) (all of the above-mentioned are tradenames), and the like may be used.

Examples of the vitamin antioxidant include tocopherol and 2,5,7,8-tetramethyl-2-(4',8',12'-trimethyltridecyl)coumarone-6-ol an example of the commercially available product including IRGANOX E201 (tradename; manufactured by BASF SE).

Lactone antioxidant shown in JP-7-233160A and JP-7-247278A may be used. Alternatively, HP-136 (tradename for 5,7-di-t-butyl-3-(3,4-dimethylphenyl)-3H-bnzofurane-2-one, manufactured by BASF SE) and the like may also be used.

Examples of the commercially available amine antioxidant include IRGASTAB FS 042 (manufactured by BASF SE) and GENOX EP (chemical name of dialkyl-N-methylamine oxide, manufactured by Crompton Corp.) (all of the above-mentioned are tradenames).

These antioxidants may be used alone or in a combination of two or more kinds. Content of the antioxidant in the composition of the present invention is preferably 0.005 to 5 parts by mass, more preferably 0.02 to 2 parts by mass, relative to 100 parts by mass of totality of the components (A), (B) and (C), in view of not adversely affecting the effect of the present invention.

Photo-Stabilizer

Although any photo-stabilizers may be used, a hindered amine photo-stabilizer is preferable. Specific examples thereof include ADK STAB LA-52, LA-57, LA-62, LA-63, LA-67, LA-68, LA-77, LA-82, LA-87, and LA-94 (all of them are manufactured by ADEKA Corp.); Tinuvin 123, 144, 440, 662, 765, and 770DF, and Chimassorb 2020, 119, and 944 (all of them are manufactured by BASF SE); Hostavin N30 (manufactured by Hoechst SE); Cyasorb UV-3346 and UV-3526 (both are manufactured by Cytech, Inc.); Uval 299 (manufactured by GLC Corp.); and Sanduvor PR-31 (manufactured by Clariant SE) (all of the above-mentioned are tradenames).

These photo-stabilizers may be used alone or in a combination of two or more kinds.

Content of the photo-stabilizer in the composition of the present invention is preferably 0.005 to 5 parts by mass, more preferably 0.002 to 2 parts by mass, relative to 100 parts by mass of totality of the components (A), (B) and (C), in view of not adversely affecting the effect of the present invention.

Method for Producing (Meth)acrylate Composition

The composition of the present invention may be obtained by mixing the foregoing component (A), component (B), component (C), component (D), component (E) and optionally component (F) and an additive.

The (meth)acrylate compounds of the components (A) to (C) are liquid; and therefore, when the white pigment of the component (E) is mixed thereinto for dispersion, the white pigment tends to precipitate if viscosity of the liquid is low, thereby causing inhomogeneous color in the cured product by precipitation of the white pigment prior to curing of the composition. This is undesirable for the performance of the reflective material. In view of this, viscosity of the mixture solution of the components (A) to (C) is preferably 50 mPa·s or higher, more preferably 100 mPa·s or higher, still more preferably 200 mPa·s or higher. Since a monomer with high viscosity (for example, hydrogenated polybutadiene diacrylate) is contained in the component (A) used in the present invention, viscosity of the liquid may be increased by using such a compound. If a monomer with high viscosity is not used, the problem may be addressed by stirring the monomer composition in the vessel during the time of molding such as transfer molding or press molding as will be mentioned later.

Order of addition of each component may be determined as needed within the range not adversely affecting the effect of the present invention. For example, it is preferable that the white pigment of the component (E) be mixed and dispersed in the mixture after preparing a mixed solution of the components (A) to (D) and optionally the component (F) and an additive, thereby preparing the composition, in view of uniformly dispersing the white pigment of the component (E) in the composition.

Since the white pigment is more difficult to disperse in a more viscous solution, a rough surface or decrease in mechanical strength of the cured product may occur due to the presence of agglomerated particles. In this case, the white pigment may be well dispersed in a highly viscous solution by first adding the white pigment of the component (E) to less viscous components among the components (A) to (C) to prepare a mixed solution, followed by adding and mixing the more viscous component (A) thereinto.

A means to mix the respective components is not particularly limited and any stirrers (mixers) may be used.

Meanwhile, a mixer having a high mixing performance generally generates heat during the time of mixing so that curing may take place during mixing when the mixer is used with addition of the component (D). Therefore, in the case that a mixer having a high mixing performance is used, it is preferable that, after the components (A) to (C) and the component (E) are mixed by the mixer having a high mixing performance, the component (D) be added and mixed by stirring to the extent not to generate heat.

Cured Product and Reflective Material

The composition of the present invention gives a cured product by a radical polymerization reaction by heating the composition above the temperature to generate a radical from the component (D) (in the case of a photo-radical polymerization initiator, by irradiation with a light having a sufficient energy to generate a radical). Conditions for curing may be determined as needed by considering decomposition characteristics and so on of the polymerization initiator. The cured product obtained by curing the composition of the present invention is used suitably as a material for a reflective material.

The reflective material of the present invention may be produced by transfer molding or press molding by using the polymerizable composition of the present invention.

In the case of transfer molding, molding may be done by using a transfer molding machine with the conditions of, for example, molding pressure of 5 to 20 N/mm$^2$, molding temperature of 120 to 190° C., and molding time of 30 to 500 seconds; preferably molding temperature of 150 to 185° C. and molding time of 30 to 180 seconds. In the case of press molding, molding may be done by using a compression molding machine with the conditions of, for example, molding temperature of 120 to 190° C. and molding time of 30 to 600 seconds; preferably molding temperature of 130 to 160° C. and molding time of 30 to 300 seconds. In any of the molding methods, post-curing may be done, for example, at 150 to 185° C. for 0.5 to 24 hours.

Alternatively, a molded article may be obtained by liquid resin injection molding, insert molding, potting processing, coating processing, and the like. In addition, a molded article may be obtained by a method similar to molding of a photo-curable resin, such as by UV-cure molding. When the polymerizable composition of the present invention is molded by transfer molding, press molding, liquid resin injection molding, insert molding, potting processing, coating processing, and the like, pre-polymerization may be done.

The reflective material of the present invention has the excellent adhesion with adjacent parts such as a lead frame and a sealant. Breaking stress of the reflective material of the present invention measured by the adhesion test described in EXAMPLES is preferably 5.0 MPa or more, more preferably 5.5 MPa or more, still more preferably 7.0 MPa or more.

Meanwhile, adhesion with a sealant may be further enhanced by an activating the surface of the article with a treatment such as UV-irradiation, ozone exposure, plasma exposure, corona discharge, high-pressure discharge, and the like, after molding the reflective material of the present invention.

The reflective material of the present invention has high reflectance in the visible light region with small decrease of reflectance even after a long-term usage. Photo-reflectance of the reflective material of the present invention at 450 nm wavelength is, as its initial value, preferably 85% or more, more preferably 90% or more, still more preferably 95% or more; and after the deterioration test at 150° C. for 1,000 hours, photo-reflectance of preferably 80% or more, more preferably 85% or more, still more preferably 90% or more may be accomplished. Meanwhile, photo-reflectance is measured by the method described in EXAMPLES.

The reflective material of the present invention may be used for a lamp reflector of a liquid crystal display, a showcase reflective board, a reflective board of various illumination apparatuses, a reflective material for LED, and so on, being especially suitable for a reflective material for an optical semiconductor.

EXAMPLES

Then, the present invention will be explained in more detail by EXAMPLES; however, the present invention is not restricted at all by these EXAMPLES.

Methods for evaluation of physical properties of the cured product obtained in each of examples and comparative examples are as follows.

(1) Adhesion Test

Two silver-plated metal plates widely used in a lead frame (width of 20 mm, length of 80 mm, and thickness of 0.3 mm) were piled up with overlapping of 2 cm. Onto this overlapped area was applied each composition solution obtained by Examples or Comparative Examples and was cured to obtain a test piece. Then, the tensile shear adhesion strength thereof (breaking stress; the maximum stress at the time of breaking) was measured according to JIS K6850. As the measurement instrument, a tensile tester Autograph equipped with a controlled temperature bath (tradename: AG-10, manufactured by Shimadzu Corp.) was used.

Measurement Conditions

Measurement temperature: 23° C., humidity: 50% RH, tensile speed: 20 mm/minute, and tensile load: 10 kN (load cell)

(2) Measurement of Photo-Reflectance

Photo-reflectance of the cured test piece was measured with an autographic spectrophotometer (tradename: UV-2400 PC, manufactured by Shimadzu Corp.) equipped with a large multipurpose chamber unit for a test piece (tradename: MPC-2200, manufactured by Shimadzu Corp.). After the initial value of photo-reflectance of the cured test piece was measured, photo-reflectance of the cured test piece after being heated in an oven at 150° C. for a prescribed time period was measured.

(3) LED Burn-in Test (Evaluation of Heat Resistance and Light Resistance)

The cured test piece was fixed on an LED package mounted with a blue LED (tradename: OBL-CH2424, manufactured by GeneLite Inc.). The LED was allowed to emit light by applying an electric current of 150 mA for one week at an environmental temperature of 60° C. Surface of the cured test piece exposed to the LED light was visually checked and evaluated according to the following criteria.
Good: no color change
Poor: Color of the irradiated surface changed to brown.

Example 1

Materials used in respective components were: 6.5 g of hydrogenated polyisoprene diacrylate (tradename: SPIDA, manufactured by Osaka Organic Chemical Industry, Ltd.) as the component (A) ((meth)acrylate having a long-chain aliphatic hydrocarbon group); 3.5 g of 1-adamantyl methacrylate (tradename: Adamantate M-104, manufactured by Idemitsu Kosan Co., Ltd.) as the component (B); 0.5 g of glycidyl methacrylate (manufactured by Wako Pure Chemical Industries, Ltd.) as the component (C); 0.1 g of 1,1-bis(t-hexylperoxy)cyclohexane (tradename: Perhexa HC, manufactured by NOF Corp.) as the component (D); and 1 g of titanium dioxide (tradename: Tipaque PC-3, average particle diameter of 0.21 μm, manufactured by Ishihara Sangyo Kaisha, Ltd.) as the component (E). Firstly, the component (E) was added to the less viscous components (B), (C), and (D) and mixed using a planetary centrifugal mixer (tradename: Awatori-Rentaro, manufactured by Thinky Corp.). Then, the more viscous component (A) was added to the mixture, and the resulting mixture was stirred using the same mixer to obtain a composition.

This composition was applied on a metal plate for the adhesion test; and then, this was piled up on another plate. After heating at 150° C. for one hour in an oven, the plate was cooled to room temperature to obtain a cured test piece for the adhesion test. Result of the adhesion test is shown in Table 1.

Example 2

A composition and a cured test piece were obtained by the method similar to that in Example 1 except that the amount of the component (C) was changed to 1 g. Result of the adhesion test is shown in Table 1.

Example 3

A composition and a cured test piece were obtained by the method similar to that in Example 1 except that the amount of the component (C) was changed to 2 g. Result of the adhesion test is shown in Table 1.

Example 4

A composition and a cured test piece were obtained by the method similar to that in Example 1 except that 1 g of 4-hydroxybutyl acrylate (tradename: 4HBA, manufactured by Nippon Kasei Chemical Co., Ltd.) was used as the component (C). Result of the adhesion test is shown in Table 1.

Comparative Example 1

A composition and a cured test piece were obtained by the method similar to that in Example 1 except that the component (C) was not used. Result of the adhesion test is shown in Table 1.

TABLE 1

|  |  | Example 1 | Example 2 | Example 3 | Example 4 | Comparative Example 1 |
|---|---|---|---|---|---|---|
| Component (A) | Hydrogenated polyisoprene diacrylate (g) | 6.5 | 6.5 | 6.5 | 6.5 | 6.5 |
|  | (% by mass) *1 | 61.9% | 59.1% | 54.2% | 59.1% | 65.0% |
| Component (B) | 1-Adamantyl methacrylate (g) | 3.5 | 3.5 | 3.5 | 3.5 | 3.5 |
|  | (% by mass) *1 | 33.3% | 31.8% | 29.2% | 31.8% | 35.0% |
| Component (C) | Glycidyl methacrylate (g) | 0.5 | 1 | 2 | — | — |
|  | (% by mass) *1 | 4.8% | 9.1% | 16.6% | — | — |
|  | 4-Hydroxybutyl acrylate (g) | — | — | — | 1 | — |
|  | (% by mass) *1 | — | — | — | 9.1% | — |
| Component (D) | 1,1-Bis(t-hexylperoxy)cyclohexane (g) | 0.1 | 0.1 | 0.1 | 0.1 | 0.1 |
|  | (parts by mass) *2 | 1.0 | 0.9 | 0.8 | 0.9 | 1.0 |
| Component (E) | Titanium dioxide (g) | 1 | 1 | 1 | 1 | 1 |
|  | (parts by mass) *2 | 9.5 | 9.1 | 8.3 | 9.1 | 10.0 |
| Adhesion | Stress at maximum point (MPa) | 5.5 | 7.4 | 10 | 5.8 | 3.3 |

*1: % by mass based on totality of the components (A), (B) and (C)
*2: parts by mass relative to 100 parts by mass of totality of the components (A), (B) and (C)

As shown in Table 1, it was observed that the component (C) is effective in adhesion with the lead frame material. Accordingly, it was found that the composition of the present invention provides a cured product having the excellent adhesion with adjacent parts (especially with the lead frame).

Example 5

Materials used in respective components were: 15 g of lauryl acrylate ((meth)acrylate having a long-chain aliphatic hydrocarbon group; tradename: SR-335, manufactured by Sartomer, LLC) and 5 g of polyethylene glycol #400 dimethacrylate (polyalkyleneglycol (meth)acrylate having number-average molecular weight of not less than 400; tradename: NK Ester 9G (molecular weight: 536), manufactured by Shin-Nakamura Chemical Co., Ltd.) as the component (A); 25 g of 1-adamantyl methacrylate (tradename: Adamantate M-104, manufactured by Idemitsu Kosan Co., Ltd.) as the component (B); 5 g of glycidyl methacrylate (manufactured by Wako Pure Chemical Industries, Ltd.) as the component (C); 0.5 g of 1,1-bis(t-hexylperoxy)cyclohexane (tradename: Perhexa HC, manufactured by NOF Corp.) as the component (D), and 0.25 g of antioxidant (tradename: IRGANOX 3114, chemical name: tris(3,5-di-t-butyl-4-hydroxybenzyl)isocyanurate, manufactured by BASF SE); and 75 g of titanium dioxide (average particle diameter: 0.21 μm, tradename: Tipaque PC-3, manufactured by Ishihara Sangyo Kaisha, Ltd.) as the component (E). In this Example, because a highly viscous monomer is not contained, the components (A) to (D) and the antioxidant were mixed using a planetary centrifugal mixer (tradename: Awatori-Rentaro, manufactured by Thinky Corp.); and then, the component (E) was added to the mixture, and the resulting mixture was stirred using the same mixer to obtain a composition.

Then, a spacer having 3 mm thickness made of tetrafluoroethylene and an aluminum plate having 3 mm thickness were inserted between two steel plates in such a manner that the aluminum plate may be tucked in between the steel plate and the spacer to make a cell. The above-mentioned composition was poured into the space of the cell, and the cell was heated in an oven at 150° C. for one hour, and then cooled to room temperature. The steel plates, the spacer, and the aluminum plate were removed to obtain a cured test piece composed of the composition. Measurement of the photo-reflectance and the LED burn-in test were carried out using the cured test piece according to the methods mentioned above. The results are shown in Table 2.

Example 6

Materials used in respective components were: 25 g of hydrogenated polybutadiene diacrylate (tradename: SPBDA-S30, manufactured by Osaka Organic Chemical Industry, Ltd.) as the component (A); 22.5 g of 1-adamantyl methacrylate (tradename: Adamantate M-104, manufactured by Idemitsu Kosan Co., Ltd.) as the component (B); 2.5 g of glycidyl methacrylate (manufactured by Wako Pure Chemical Industries, Ltd.) as the component (C); 1 g of 1,1-bis(t-hexylperoxy)cyclohexane (tradename: Perhexa HC, manufactured by NOF Corp.) as the component (D), and 0.25 g of Sumilizer GA-80 (tradename of 3,9-bis[1,1-dimethyl-2-{β-(3-t-butyl-4-hydroxy-5-methylphenyl)propionyloxy}ethyl]-2,4,8,10-tetraoxaspiro[5,5]undecane, manufactured by Sumitomo Chemical Co., Ltd.) and 0.25 g of Sumilizer TP-D (tradename of pentaerythritol tetrakis(3-laurylthiopropionate), manufactured by Sumitomo Chemical Co., Ltd.) as the antioxidants; and 35 g of titanium dioxide (tradename: Tipaque PC-3, manufactured by Ishihara Sangyo Kaisha, Ltd.) as the component (E). Firstly, the component (E) was added to the less viscous components (B) to (D) and antioxidants and mixed using a planetary centrifugal mixer (tradename: Awatori-Rentaro, manufactured by Thinky Corp.). Then, the more viscous component (A) was added to the mixture, and the resulting mixture was stirred using the same mixer to obtain a composition.

A cured test piece was obtained by the method similar to that in Example 5 except that this composition was used; and then, measurement of the photo-reflectance and the LED burn-in test were carried out. The results are shown in Table 2.

Example 7

Materials used in respective components were: 25 g of hydrogenated polyisoprene diacrylate (tradename: SPIDA, manufactured by Osaka Organic Chemical Industry, Ltd.) as the component (A); 22.5 g of 1-adamantyl methacrylate (tradename: Adamantate M-104, manufactured by Idemitsu Kosan Co., Ltd.) as the component (B); 2.5 g of glycidyl methacrylate (manufactured by Wako Pure Chemical Industries, Ltd.) as the component (C); 1 g of 1,1-bis(t-hexylperoxy)cyclohexane (tradename: Perhexa HC, manufactured by NOF Corp.) as the component (D), and 0.25 g of Sumilizer GA-80 (tradename, manufactured by Sumitomo Chemical Co., Ltd.) and 0.25 g of Sumilizer TP-D (tradename, manufactured by Sumitomo Chemical Co., Ltd.) as the antioxidants; and 5 g of titanium dioxide (tradename: Tipaque PC-3, manufactured by Ishihara Sangyo Kaisha, Ltd.) as the component (E). These compounds were mixed in the same order as Example 6 to obtain a composition.

A cured test piece was obtained by the method similar to that in Example 5 except that this composition was used; and then, measurement of the photo-reflectance and the LED burn-in test were carried out. The results are shown in Table 2.

Example 8

A composition was obtained by the method similar to that in Example 7 except that 12.5 g of the component (E) was used in Example 7.

A cured test piece was obtained by the method similar to that in Example 5 except that this composition was used; and then, measurement of the photo-reflectance and the LED burn-in test were carried out. The results are shown in Table 2.

Example 9

Materials used in respective components were: 15 g of lauryl acrylate (tradename: SR335, manufactured by Sartomer, LLC) and 10 g of ethoxylated (9) trimethylolpropane triacrylate (tradename: SR-502, molecular weight: 692, manufactured by Sartomer, LLC) as the component (A); 22.5 g of 1-adamantyl methacrylate (tradename: Adamantate M-104, manufactured by Idemitsu Kosan Co., Ltd.) as the component (B); 2.5 g of glycidyl methacrylate (manufactured by Wako Pure Chemical Industries, Ltd.) as the component (C); 0.5 g of 1,1-bis(t-hexylperoxy)cyclohexane (tradename: Perhexa HC, manufactured by NOF Corp.) as the component (D), and 0.25 g of Sumilizer GA-80 (tradename, manufactured by Sumitomo Chemical Co., Ltd.) and 0.25 g of Sumilizer TP-D (tradename, manufactured by Sumitomo Chemical Co., Ltd.) as the antioxidants; and 50 g of titanium dioxide (tradename of Tipaque PC-3, manufactured by Ishihara Sangyo Kaisha, Ltd.) as the component (E). These compounds were mixed in the same order as Example 5 to obtain a composition.

A cured test piece was obtained by the method similar to that in Example 5 except that this composition was used; and then, measurement of the photo-reflectance and the LED burn-in test were carried out. The results are shown in Table 2.

Example 10

Materials used in respective components were: 25 g of dual-end reactive silicone oil (tradename: X-22-164E, manufactured by Shin-Etsu Chemical Co., Ltd.) as the component (A); 22.5 g of 1-adamantyl methacrylate (tradename: Adamantate M-104, manufactured by Idemitsu Kosan Co., Ltd.) as the component (B); 2.5 g of glycidyl methacrylate (manufactured by Wako Pure Chemical Industries, Ltd.) as the component (C); 0.5 g of 1,1-bis(t-hexylperoxy)cyclohexane (tradename: Perhexa HC, manufactured by NOF Corp.) as the component (D), and 0.25 g of Sumilizer GA-80 (tradename, manufactured by Sumitomo Chemical Co., Ltd.) and 0.25 g of Sumilizer TP-D (tradename, manufactured by Sumitomo Chemical Co., Ltd.) as the antioxidants; and 5 g of titanium dioxide (tradename of Tipaque PC-3, manufactured by Ishihara Sangyo Kaisha, Ltd.) as the component (E). These compounds were mixed in the same order as Example 6 to obtain a composition.

A cured test piece was obtained by the method similar to that in Example 5 except that this composition was used; and then, measurement of the photo-reflectance and the LED burn-in test were carried out. The results are shown in Table 2.

Comparative Example 2

Measurement of the photo-reflectance and the LED burn-in test were carried out using a plate of white polyphthalamide resin (tradename: AMODEL A-4122NL, manufactured by Solvay Advanced Polymers, LLC). The results are shown in Table 2.

Comparative Example 3

Materials used in respective components were: 2.5 g of hydrogenated polyisoprene diacrylate (tradename: SPIDA, manufactured by Osaka Organic Chemical Industry, Ltd.) as the component (A); 46.5 g of 1-adamantyl methacrylate (tradename: Adamantate M-104, manufactured by Idemitsu Kosan Co., Ltd.) as the component (B); 1.0 g of glycidyl methacrylate (manufactured by Wako Pure Chemical Industries, Ltd.) as the component (C); 1 g of 1,1-bis(t-hexylperoxy)cyclohexane (tradename: Perhexa HC, manufactured by NOF Corp.) as the component (D), and 0.25 g of Sumilizer GA-80 (tradename, manufactured by Sumitomo Chemical Co., Ltd.) and 0.25 g of Sumilizer TP-D (tradename, manufactured by Sumitomo Chemical Co., Ltd.) as the antioxidants; and 5 g of titanium dioxide (tradename: Tipaque PC-3, manufactured by Ishihara Sangyo Kaisha, Ltd.) as the component (E). These compounds were mixed in the same order as Example 6 to obtain a composition.

When an attempt was made to obtain a cured test piece similarly to Example 5 except that this composition was used, only a cracked test piece was obtained so that it could not be evaluated.

Comparative Example 4

Materials used in respective components were: 25 g of triethylene glycol dimethacrylate (tradename: NK Ester 3G, molecular weight: 286, manufactured by Shin-Nakamura Chemical Co., Ltd.), which does not correspond to the component (A); 22.5 g of 1-adamantyl methacrylate (tradename: Adamantate M-104, manufactured by Idemitsu Kosan Co., Ltd.) as the component (B); 2.5 g of glycidyl methacrylate (manufactured by Wako Pure Chemical Industries, Ltd.) as the component (C); 0.5 g of 1,1-bis(t-hexylperoxy)cyclohexane (tradename: Perhexa HC, manufactured by NOF Corp.) as the component (D), and 0.25 g of Sumilizer GA-80 (tradename, manufactured by Sumitomo Chemical Co., Ltd.) and 0.25 g of Sumilizer TP-D (tradename, manufactured by Sumitomo Chemical Co., Ltd.) as the antioxidants; and 5 g of titanium dioxide (tradename: Tipaque PC-3, manufactured by Ishihara Sangyo Kaisha, Ltd.) as the component (E). These compounds were mixed in the same order as Example 5 to obtain a composition.

When an attempt was made to obtain a cured test piece similarly to Example 5 except that this composition was used, only a cracked test piece was obtained so that it could not be evaluated.

after 168 hours at 150° C. In addition, color of the irradiated surface was changed to brown after the LED burn-in test. In Comparative Example 3 in which content of the component (A) was too small and in Comparative Example 4 in which polyalkylene glycol (meth)acrylate having number-average molecular weight of not more than 400, which does not correspond to the component (A), was used, flexibility could not be obtained because contribution of the component (A) was too small. On the contrary, in Examples 5 to 10 in which compositions of the present invention were used, not only the initial values of photo-reflectance (98 to 99%), but also the values even after 1,000 hours at 150° C. were high (93 to 96%). In addition, there was no color change after the LED burn-in test. Accordingly, it was concluded that the composition of the present invention can provide a cured product having high reflectance in the visible light region without decrease of the reflectance even after a long-term usage, and having the excellent heat resistance and light resistance with less yellowing.

TABLE 2

| | | Example 5 | Example 6 | Example 7 | Example 8 | Example 9 | Example 10 | Comparative Example 2 | Comparative Example 3 | Comparative Example 4 |
|---|---|---|---|---|---|---|---|---|---|---|
| Component (A) | Dual-end reactive silicone oil (g) | — | — | — | — | — | 25 | White Polyphthalamide resin | — | — |
| | (% by mass) *1 | — | — | — | — | — | 50% | | — | — |
| | Lauryl acrylate (g) | 15 | — | — | — | 15 | — | | — | — |
| | (% by mass) *1 | 30% | — | — | — | 30% | — | | — | — |
| | Polyethylene glycol #400 dimethacrylate (g) | 5 | — | — | — | — | — | | — | — |
| | (% by mass) *1 | 10% | — | — | — | — | — | | — | — |
| | Hydrogenated polybutadiene diacrylate (g) | — | 25 | — | — | — | — | | — | — |
| | (% by mass) *1 | — | 50% | — | — | — | — | | — | — |
| | Hydrogenated polyisoprene diacrylate (g) | — | — | 25 | 25 | — | — | | 2.5 | — |
| | (% by mass) *1 | — | — | 50% | 50% | — | — | | 5% | — |
| | Ethoxylated (9) trimethylolpropane triacrylate (g) | — | — | — | — | 10 | — | | — | — |
| | (% by mass) *1 | — | — | — | — | 20% | — | | — | — |
| | Triethylene glycol dimethacrylate (g) | — | — | — | — | — | — | | — | 25 |
| | (% by mass) *1 | — | — | — | — | — | — | | — | 50% |
| Component (B) | 1-Adamantyl methacrylate (g) | 25 | 22.5 | 22.5 | 22.5 | 22.5 | 22.5 | | 46.5 | 22.5 |
| | (% by mass) *1 | 50% | 45% | 45% | 45% | 45% | 45% | | 93% | 45% |
| Component (C) | Glycidyl methacrylate (g) | 5 | 2.5 | 2.5 | 2.5 | 2.5 | 2.5 | | 1 | 2.5 |
| | (% by mass) *1 | 10% | 5% | 5% | 5% | 5% | 5% | | 2% | 5% |
| Component (D) | 1,1-Bis(t-hexylperoxy)-cyclohexane (g) | 0.5 | 1 | 1 | 1 | 0.5 | 0.5 | | 1 | 0.5 |
| | (parts by mass) *2 | 1 | 2 | 2 | 2 | 1 | 1 | | 2 | 1 |
| Antioxidant | IRGANOX 3114 (g) | 0.25 | — | — | — | — | — | | — | — |
| | Sumilizer GA-80 (g) | — | 0.25 | 0.25 | 0.25 | 0.25 | 0.25 | | 0.25 | 0.25 |
| | Sumilizer TP-D (g) | — | 0.25 | 0.25 | 0.25 | 0.25 | 0.25 | | 0.25 | 0.25 |
| Component (E) | Titanium dioxide (g) | 75 | 35 | 5 | 12.5 | 50 | 5 | | 5 | 5 |
| | (parts by mass) *2 | 150 | 70 | 10 | 25 | 100 | 10 | | 10 | 10 |
| Photo-reflectance (%) (450 nm) | Initial | 98 | 98 | 98 | 99 | 99 | 98 | 90 | Unevaluable | Unevaluable |
| | After 168 hours at 150° C. | — | — | — | — | — | — | 57 | | |
| | After 1000 hours at 150° C. | 93 | 95 | 94 | 96 | 96 | 95 | — | | |
| Heat resistance and light resistance | | Good | Good | Good | Good | Good | Good | Poor | | |

IRGANOX 3114: trade name, manufactured by BASF SE
Sumilizer GA-80: trade name, manufactured by Sumitomo Chemical Co., Ltd.
Sumilizer TP-D: trade name, manufactured by Sumitomo Chemical Co., Ltd.
*1: % by mass based on totality of the components (A), (B) and (C)
*2: parts by mass relative to 100 parts by mass of totality of the components (A), (B) and (C)

As can be seen in Table 2, in Comparative Example 2 in which white polyphthalamide resin was used, initial value of the photo-reflectance was 90%, which was decreased to 57%

INDUSTRIAL APPLICABILITY

The (meth)acrylate composition of the present invention can provide a cured product having high reflectance in the visible light region with the excellent whiteness, heat resistance, and light resistance, and with less yellowing, and in addition, having the excellent adhesion with adjacent parts (especially with the lead frame); and thus, the composition can be used suitably as a raw material of a reflective material for an optical semiconductor.

The reflective material made using the cured product obtained by curing the (meth)acrylate composition of the present invention does not decrease in its reflectance even after a long-term usage, while having high reflectance in the visible light region and the excellent adhesion with adjacent parts. The reflective material of the present invention may be used for a lamp reflector of a liquid crystal display, a reflective board of a showcase, a reflective board of various illumination apparatuses, a reflective material for LED, and so on. Specific examples of a photoelectric conversion element containing the reflective material of the present invention and a photoelectric conversion device containing the photoelectric conversion element include various OA equipment, electric and electronic equipment and parts thereof, and automobile parts, such as a display, a destination sign board, a car lamp, a signal light, an emergency light, a cell phone, and a video camera.

The invention claimed is:

1. A (meth)acrylate composition comprising:
   (A) at least one (meth)acrylate compound selected from the group consisting of a (meth)acrylate-modified silicone oil, a (meth)acrylate comprising a hydrogenated polybutadiene backbone or a hydrogenated polyisoprene backbone, or stearyl methacrylate, and a polyalkylene glycol (meth)acrylate having a number-average molecular weight of not less than 400,
   wherein the polyalkylene glycol (meth)acrylate having number-average molecular weight of not less than 400 is selected from the group consisting of polyethylene glycol di(meth)acrylate, polypropylene glycol di(meth)acrylate, polybutylene glycol di(meth)acrylate, ethoxylated trimethylolpropane tri(meth)acrylate, and ethoxylated pentaerythritol tetra(meth)acrylate,
   (B) an alkyl (meth)acrylate compound comprising an alicyclic hydrocarbon group having 6 or more carbon atoms,
   (C) a (meth)acrylate compound comprising a polar group selected from the group consisting of epoxy, glycidyl ether, isocyanate, alkoxysilyl, oxetane, and tetrahydropyranyl,
   (D) a radical polymerization initiator, and
   (E) a white pigment,
   wherein
   the white pigment (E) is surface-treated with an alkylation treatment, a trimethylsilyl treatment, a silicone treatment, or a treatment by a coupling agent,
   an amount of the at least one (meth)acrylate compound (A) is from 5 to 90% by mass, an amount of the alkyl (meth)acrylate compound (B) is from 5 to 90% by mass, and an amount of the (meth)acrylate compound (C) is from 0.5 to 50% by mass, based on the total of the components (A), (B), and (C), and
   an amount of the radical polymerization initiator (D) is from 0.01 to 10 parts by mass and an amount of the white pigment (E) is from 3 to 200 parts by mass, relative to 100 parts by mass of a total of the components (A), (B), and (C).

2. The (meth)acrylate composition according to claim 1, wherein the at least one (meth)acrylate compound (A) is a polyalkylene glycol (meth)acrylate having a number-average molecular weight of not less than 400.

3. The (meth)acrylate composition according to claim 1, wherein the alkyl (meth)acrylate compound comprising an alicyclic hydrocarbon group (B) is an alkyl (meth)acrylate compound having at least one alicyclic hydrocarbon group selected from the group consisting of adamantyl, norbornyl, isobornyl, dicyclopentanyl, and cyclohexyl.

4. A cured product obtained by a process comprising curing the (meth)acrylate composition according to claim 1.

5. A reflective material comprising the cured product according to claim 4.

6. The reflective material according to claim 5, wherein said reflective material is suitable for an optical semiconductor.

7. The (meth)acrylate composition according to claim 2, wherein the alkyl (meth)acrylate compound comprising an alicyclic hydrocarbon group (B) is an alkyl (meth)acrylate compound having at least one alicyclic hydrocarbon group selected from the group consisting of adamantyl, norbornyl, isobornyl, dicyclopentanyl, and cyclohexyl.

8. The (meth)acrylate composition according to claim 1, wherein the (meth)acrylate-modified silicone oil is a polydialkyl siloxane having an acryloxyalkyl terminal or a methacryloxyalkyl terminal.

9. The (meth)acrylate composition according to claim 1, wherein the polyalkylene glycol (meth)acrylate has a number-average molecular weight of from 400 to 10,000.

10. The (meth)acrylate composition according to claim 1, wherein the amount of the compound (A) is from 15 to 80% by mass, the amount of the compound (B) is from 10 to 80% by mass, and the amount of the compound (C) is from 1 to 40% by mass, based on a total of the components (A), (B) and (C).

11. The (meth)acrylate composition according to claim 1, wherein the radical polymerization initiator (D) is at least one selected from the group consisting of a ketone peroxide, hydroperoxide, diacyl peroxide, dialkyl peroxide, peroxyketal, alkyl perester, and peroxy carbonate.

12. The (meth)acrylate composition according to claim 1, wherein the while pigment (E) is at least one selected from the group consisting of a titanium dioxide, alumina, zirconium oxide, zinc sulfide, zinc oxide, magnesium oxide, potassium titanate, barium sulfate, calcium carbonate, and silicone particle.

13. The (meth)acrylate composition according to claim 1, wherein the amount of the radical polymerization initiator (D) is from 0.1 to 5 parts by mass and the amount of the while pigment (E) is from 3 to 150 parts by mass, relative to 100 parts by mass of a total of the components (A), (B) and (C).

14. The (meth)acrylate composition according to claim 1, wherein an average particle diameter of the white pigment (E) in the composition is from 0.01 to 0.5 μm.

15. The (meth)acrylate composition according to claim 1, further comprising from 100 parts or less by mass, relative to 100 parts by mass of a total of the components (A), (B) and (C), of a (meth)acrylate compound other than the components (A) to (C) as a component (F).

16. The (meth)acrylate composition according to claim 1, wherein the alkyl (meth)acrylate compound comprising an alicyclic hydrocarbon group (B) is an alkyl (meth)acrylate compound having at least one alicyclic hydrocarbon group selected from the group consisting of adamantyl, norbornyl, isobornyl, and dicyclopentanyl.

17. The (meth)acrylate composition according to claim 1, wherein the alkyl (meth)acrylate compound comprising an alicyclic hydrocarbon group (B) is an alkyl (meth)acrylate compound having at least one alicyclic hydrocarbon group selected from the group consisting of isobornyl and cyclohexyl.

18. The (meth)acrylate composition according to claim 1, wherein an average particle diameter of the white pigment (E) in the composition is from 0.15 to 0.3 μm.

19. A (meth)acrylate composition comprising:
(A) at least one (meth)acrylate compound selected from the group consisting of a hydrogenated polybutadiene di(meth)acrylate, hydrogenated polyisoprene di(meth)acrylate, and a polyethylene glycol di(meth)acrylate having a number-average molecular weight of not less than 400,
(B) an alkyl (meth)acrylate compound comprising an alicyclic hydrocarbon group having 6 or more carbon atoms,
(C) a (meth)acrylate compound comprising a polar group selected from the group consisting of epoxy, glycidyl ether, isocyanate, alkoxysilyl, oxetane, and tetrahydropyranyl,
(D) a radical polymerization initiator, and
(E) a white pigment,
wherein
the white pigment (E) is surface-treated with an alkylation treatment, a trimethylsilyl treatment, a silicone treatment, or a treatment by a coupling agent,
an amount of the at least one (meth)acrylate compound (A) is from 5 to 90% by mass, an amount of the alkyl (meth)acrylate compound (B) is from 5 to 90% by mass, and an amount of the (meth)acrylate compound (C) is from 0.5 to 50% by mass, based on the total of the components (A), (B), and (C), and
an amount of the radical polymerization initiator (D) is from 0.01 to 10 parts by mass and an amount of the white pigment (E) is from 3 to 200 parts by mass, relative to 100 parts by mass of a total of the components (A), (B), and (C).

20. A (meth)acrylate composition comprising:
(A) at least one (meth)acrylate compound selected from the group consisting of a (meth)acrylate-modified silicone oil, a (meth)acrylate comprising a hydrogenated polybutadiene backbone or a hydrogenated polyisoprene backbone, or stearyl methacrylate, and a polyalkylene glycol (meth)acrylate having a number-average molecular weight of not less than 400,
(B) an alkyl (meth)acrylate compound comprising an alicyclic hydrocarbon group having 6 or more carbon atoms,
(C) a (meth)acrylate compound comprising a polar group selected from the group consisting of epoxy, glycidyl ether, isocyanate, alkoxysilyl, oxetane, and tetrahydropyranyl,
(D) a radical polymerization initiator, and
(E) a white pigment comprising hollow particles,
wherein
the white pigment (E) is surface-treated with an alkylation treatment, a trimethylsilyl treatment, a silicone treatment, or a treatment by a coupling agent,
an amount of the at least one (meth)acrylate compound (A) is from 5 to 90% by mass, an amount of the alkyl (meth)acrylate compound (B) is from 5 to 90% by mass, and an amount of the (meth)acrylate compound (C) is from 0.5 to 50% by mass, based on the total of the components (A), (B), and (C), and
an amount of the radical polymerization initiator (D) is from 0.01 to 10 parts by mass and an amount of the white pigment (E) is from 3 to 200 parts by mass, relative to 100 parts by mass of a total of the components (A), (B), and (C).

* * * * *